United States Patent
Chiu

Patent Number: 6,137,361
Date of Patent: *Oct. 24, 2000

[54] LOW POWER CLASS A AMPLIFIER CIRCUIT

[75] Inventor: Kwok Fu Chiu, San Jose, Calif.

[73] Assignee: National Semiconductor Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/243,641

[22] Filed: Feb. 3, 1999

[51] Int. Cl.$^7$ ........................................................ H03F 3/45
[52] U.S. Cl. ............................................ 330/253; 330/261
[58] Field of Search ...................................... 330/252, 253, 330/261, 257

[56] References Cited

U.S. PATENT DOCUMENTS

| | | | |
|---|---|---|---|
| 4,607,232 | 8/1986 | Gill, Jr. | 330/255 |
| 4,667,164 | 5/1987 | Doluca | 330/253 |
| 5,442,319 | 8/1995 | Seesink et al. | 330/261 |
| 5,515,006 | 5/1996 | Chan | 330/255 |
| 5,841,317 | 11/1998 | Ohmori et al. | 327/563 |

*Primary Examiner*—Robert Pascal
*Assistant Examiner*—Henry Choe
*Attorney, Agent, or Firm*—Baker & McKenzie

[57] ABSTRACT

A low power class A amplifier circuit for driving the output load terminal with current source and sink circuits. Based upon an internally generated control signal, the output sinking current conducted by the current sink circuit remains constant regardless of input signal level and output load resistance, while the output sourcing current provided by the current source circuit varies in relation to the input signal and output load resistance. Hence, the output source current increases and decreases as the input signal increases and decreases and as the output load resistance decreases and increases, respectively. This results in reduced output "standby" current, thereby reducing the "standby" power dissipation of the circuit during no, or low, output load conditions.

26 Claims, 12 Drawing Sheets

LOW POWER CLASS A AMPLIFIER CIRCUIT

BACKGROUND OF THE INVENTION

1. Field of the Invention

The present invention relates to class A amplifier circuits, and in particular to class A amplifier circuits in which standby, or reserve, current drawn from the power supply is reduced during low signal or reduced loading conditions.

2. Description of the Related Art

Referring to FIG. 1, a conventional operational amplifier ("op-amp") with a class A output includes a differential input stage and a single-ended output stage. The input stage includes a differential amplifier (P-MOSFETs M1 and M2) biased between a current source I12 and a current mirror circuit (N-MOSFETs M3 and M4). Under nominal dc bias conditions, with no input signal VIN applied, the input transistors M1, M2, which are matched, share the dc biased current I12 which splits evenly into currents I1 and I2. When an input signal VIN is applied, these currents I1, I2 vary in an opposing relationship depending upon the magnitude of the opposing phases IN, IN+ of the differential input signal VIN. This results in a signal-dependent signal voltage V4 at the drain terminal of transistor M4. This signal V4 is amplified to produce an output current I5 by a common source amplifier in the form of N-MOSFET M5.

The output supply current IS, which is constant, provides the source current for the output, or load, terminal to which the load RL is connected. This source current IS divides between the sinking output current I5 through transistor M5 and the load current IL through the load RL. Hence, depending upon the level of the input signal VIN and the resistance of the load RL, more or less load current IL and less or more sink current I5 flows, respectively.

The source current IS is required at all times to ensure that load current IL is available for the load RL under all conditions. Accordingly, the minimum value of this source current IS must be greater than the maximum expected value of the load current IL. However, as is well known, due to such things as fabrication process variations and variations in current due to temperature variations, as well as variations in the resistance of the load RL, an additional margin of source current IS must be provided to ensure sufficient source current IS is available under all possible conditions. Under many conditions, this can cause the required source current IS to be as much as 5 or 6 times as high as the typical load current IL. As will easily be appreciated, this results in an extremely inefficient use of power which is particularly undesirable for battery-operated circuits.

Accordingly, it would be desirable to have a class A output amplifier stage in which the source current IS could be controlled in accordance with the magnitude of the input signal VIN and resistance of the load RL. This would allow the majority of the source current IS to be used to drive the load RL under all conditions, with minimal additional reserve current.

SUMMARY OF THE INVENTION

A low power class A amplifier circuit in accordance with the present invention provides a variable controlled source current to minimize current drain from the power supply during low signal and light loading conditions. Hence, the magnitude of the source current drawn from the power supply increases and decreases as the input signal magnitude increases and decreases and as the load resistance decreases and increases, respectively.

In accordance with one embodiment of the present invention, a low power class A amplifier circuit includes a load circuit terminal, an input amplifier circuit, a current sink circuit, a current source circuit and a control circuit. The load circuit terminal is configured to convey a variable source current, convey a substantially constant sink current, be coupled to a load circuit and convey a load current for the load circuit. The input amplifier circuit is configured to receive an input signal and in accordance therewith provide an amplified signal. The current sink circuit, coupled between the input amplifier circuit and the load circuit terminal, is configured to receive the amplified signal and in accordance therewith conduct the substantially constant sink current. The current source circuit, coupled to the load circuit terminal, is configured to receive a control signal and in accordance therewith provide the variable source current. The control circuit, coupled between the input amplifier circuit and the current source circuit, is configured to receive the amplified signal and in accordance therewith provide the control signal.

In accordance with another embodiment of the present invention, a low power class A amplifier circuit includes a load circuit terminal, an input amplifier circuit, a current sink circuit, a current source circuit and a control circuit. The load circuit terminal is configured to convey source and sink currents, be coupled to a load circuit and convey a load current for the load circuit. The input amplifier circuit includes internal and signal terminals and is configured to receive an input signal and in accordance therewith provide an amplified signal via the signal terminal. The current sink circuit, coupled between the input amplifier circuit signal terminal and the load circuit terminal, is configured to receive the amplified signal and in accordance therewith conduct the sink current. The current source circuit, coupled to the load circuit terminal, is configured to receive a control signal and in accordance therewith provide the source current. The control circuit, coupled between the input amplifier circuit internal and signal terminals and the current source circuit, is configured to receive the amplified signal and in accordance therewith provide the control signal. In accordance with the control signal the sink current is substantially constant and the source current varies in relation to the input signal.

In accordance with still another embodiment of the present invention, a low power class A amplifier circuit includes a load circuit terminal, an input amplifier circuit, a current sink circuit, a current source circuit and a control circuit. The load circuit terminal is configured to convey source and sink currents, be coupled to a load circuit which includes a load impedance and convey a load current for the load circuit. The input amplifier circuit includes internal and signal terminals and is configured to receive an input signal and in accordance therewith provide an amplified signal via the signal terminal. The current sink circuit, coupled between the input amplifier circuit signal terminal and the load circuit terminal, is configured to receive the amplified signal and in accordance therewith conduct the sink current. The current source circuit, coupled to the load circuit terminal, is configured to receive a control signal and in accordance therewith provide the source current. The control circuit, coupled between the input amplifier circuit internal and signal terminals and the current source circuit, is configured to receive the amplified signal and in accordance therewith provide the control signal. In accordance with the control signal the sink current is substantially constant and the source current varies in relation to the load impedance.

These and other features and advantages of the present invention will be understood upon consideration of the following detailed description of the invention and the accompanying drawings.

DETAILED DESCRIPTION OF THE INVENTION

Figure 1:
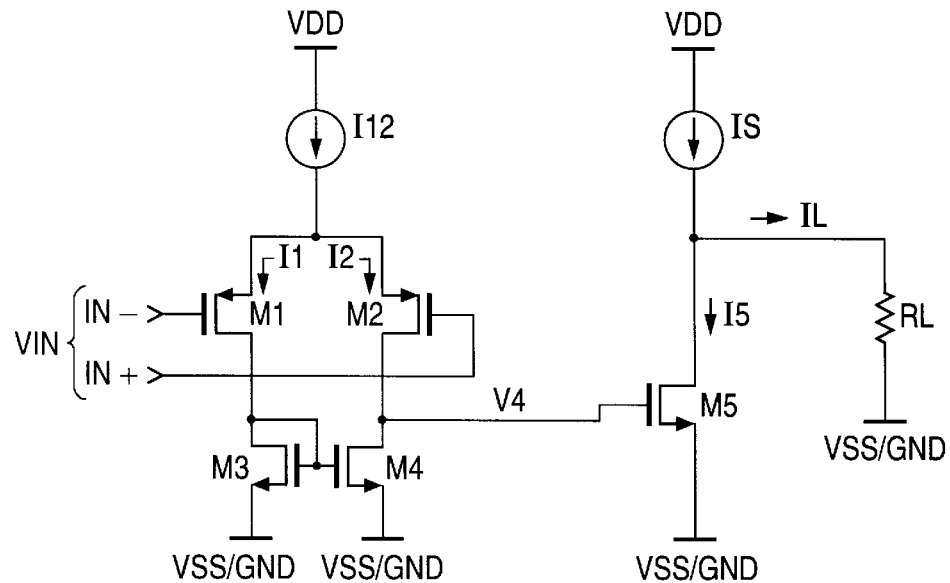
FIG. 1 is a schematic diagram of a conventional operational amplifier with a class A amplifier output stage.
Figure 2:
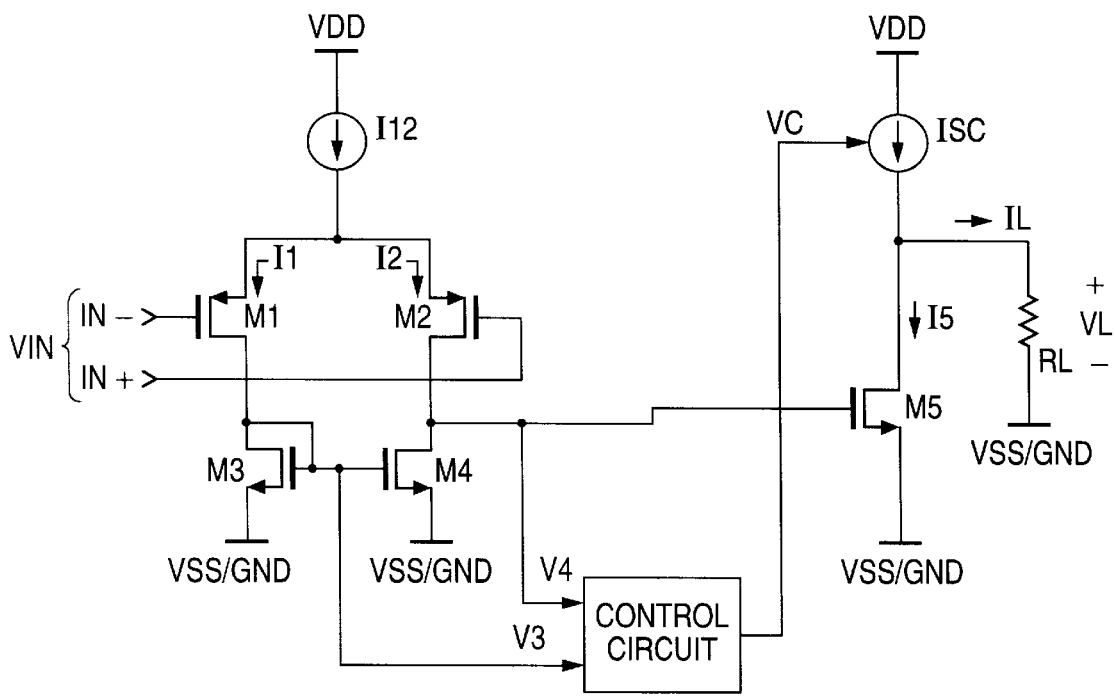
FIG. 2 is a schematic diagram of an operational amplifier with a low power class A amplifier output stage in accordance with one embodiment of the present invention.

Referring to FIG. 2, a low power class A amplifier circuit in accordance with the present invention includes a differential input stage and single-ended output stage, plus a control circuit connected between them. The differential input stage (P-MOSFETs M1 and M2 and N-MOSFETs M3 and M4) and single-ended output stage (N-MOSFET M5 and current source ISC) operate in accordance with the foregoing discussion for the circuit of FIG. 1, except that the output current source ISC is controlled in accordance with the voltages V3, V4 at the drain terminals of the current mirror circuit (N-MOSFETs M3 and M4) in the input stage. As discussed in more detail below, these voltages V3, V4 are used by the control circuit to generate a control voltage VC which determines the magnitude of the controlled source current ISC available to drive the load terminal to which the load RL is connected and through which the load current IL and output sink current I5 flow.

Using these voltages V3, V4, the control circuit controls the output source current ISC in such a manner as to cause the sink current I5 through the output current sink transistor M5 to be of such magnitude as to cause the gate-to-source voltage of transistor M5 (i.e., voltage V4) to be equal to voltage V3. This, in turn, results in a fixed output sink current I5 with a magnitude determined by the ratio of the channel dimensions of N-MOSFETs M4 and M5.

Figure 3:
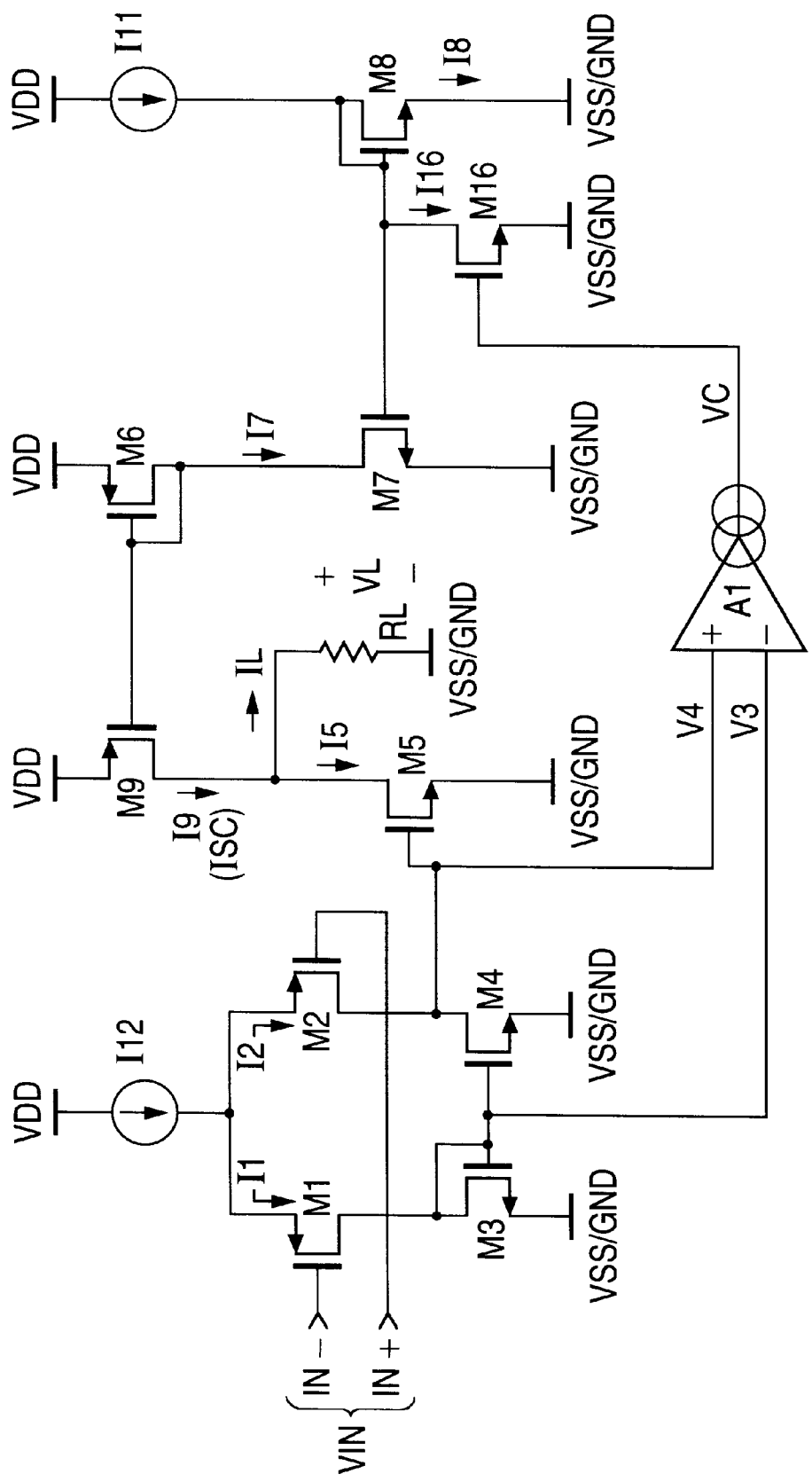
FIG. 3 is a schematic diagram of a specific embodiment of the circuit of FIG. 2.

Referring to FIG. 3, in accordance with one embodiment of the present invention, the control circuit is implemented in the form of a transconductance amplifier A1 which generates a control voltage VC in accordance with voltages V3 and V4 from the differential input stage. This control voltage VC determines the conductivity, and, therefore, the channel current I16, of bypass circuit transistor M16. As this current I16 varies, so too does the current I8 through the input current mirror transistor M8 since the fixed source current I11 divides to form these two currents I16, I8.

This, in turn, determines the mirrored output current I7 from the current mirror circuit (transistors M7 and M8) which serves as the input current to another current mirror circuit formed by transistors M6 and M9. This, further in turn, determines the second mirrored output current I9 through transistor M9. It is this current I9 that forms the controlled source current ISC for providing the load current IL and output sink current I5.

By appropriate scaling of the MOSFET channel dimensions of transistors M8, M7, M6, M9 (as is well known in the art), a low magnitude constant current I11 can be drawn from the power supply while still providing a substantially larger (due to scaling) controlled output current I9. This output current I9 is controlled, i.e., made larger or smaller, by controlling how much of current I11 is bypassed, or shunted, as current I16, thereby increasing or decreasing, respectively, the amount of current I8 available for being "mirrored" up to produce source current I9.

Figure 4:
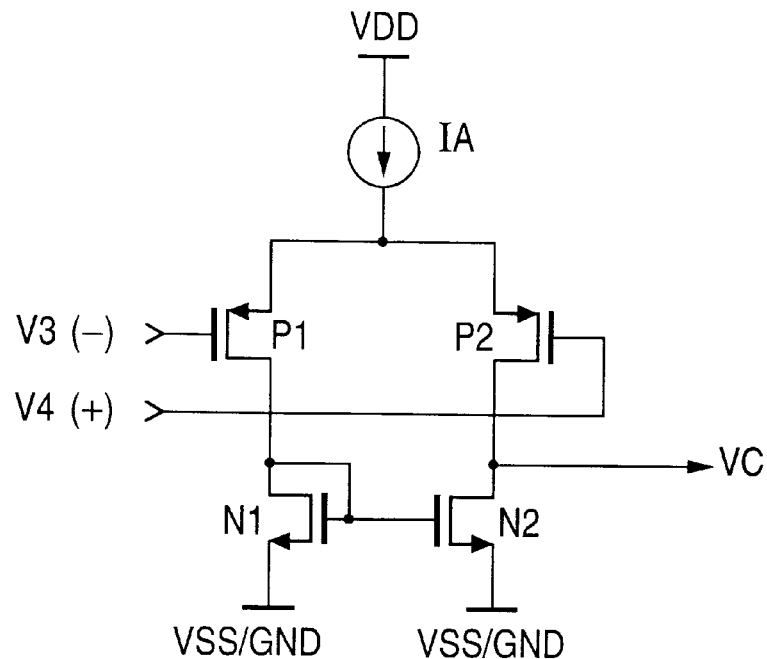
FIG. 4 is a schematic diagram of one example of a transconductance amplifier suitable for use in the circuit of FIG. 3.

Referring to FIG. 4, the transconductance amplifier A1 in the circuit of FIG. 3 can be implemented as a conventional differential amplifier, similar to the input stages of the circuits of FIGS. 1–3.

Figure 5:
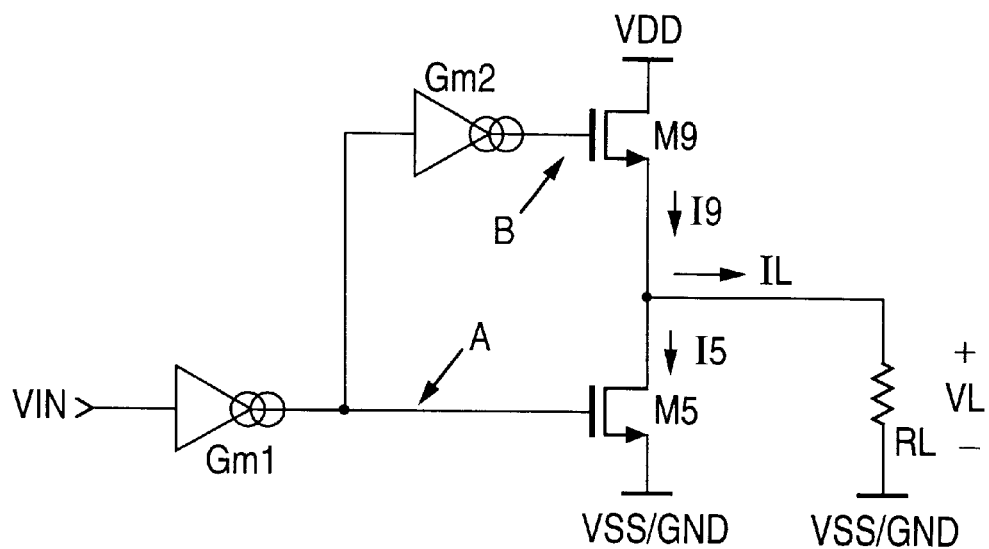
FIG. 5 is a schematic diagram of a circuit model illustrating the principle of operation of the circuit of FIG. 3.

Referring to FIG. 5, the increase in overall signal gain of the circuit of FIG. 3 can be explained using this circuit model. With the introduction of the control amplifier A1, additional gain can be expected. As long as the output current source, i.e., transistor M9, is sourcing output current I9, the signal gain can be computed according to the signal path from the input signal VIN through output to transistor M9. This gain can be computed as a product of the transconductances Gm1, Gm2 and the equivalent resistances RA, RB at nodes A and B, plus the transconductance GmM9 of transistor M9 and the load resistance RL as follows:

$$\text{Gain}=(Gm1)(RA)(Gm2)(RB)(GmM9)(RL)$$

Figure 6:
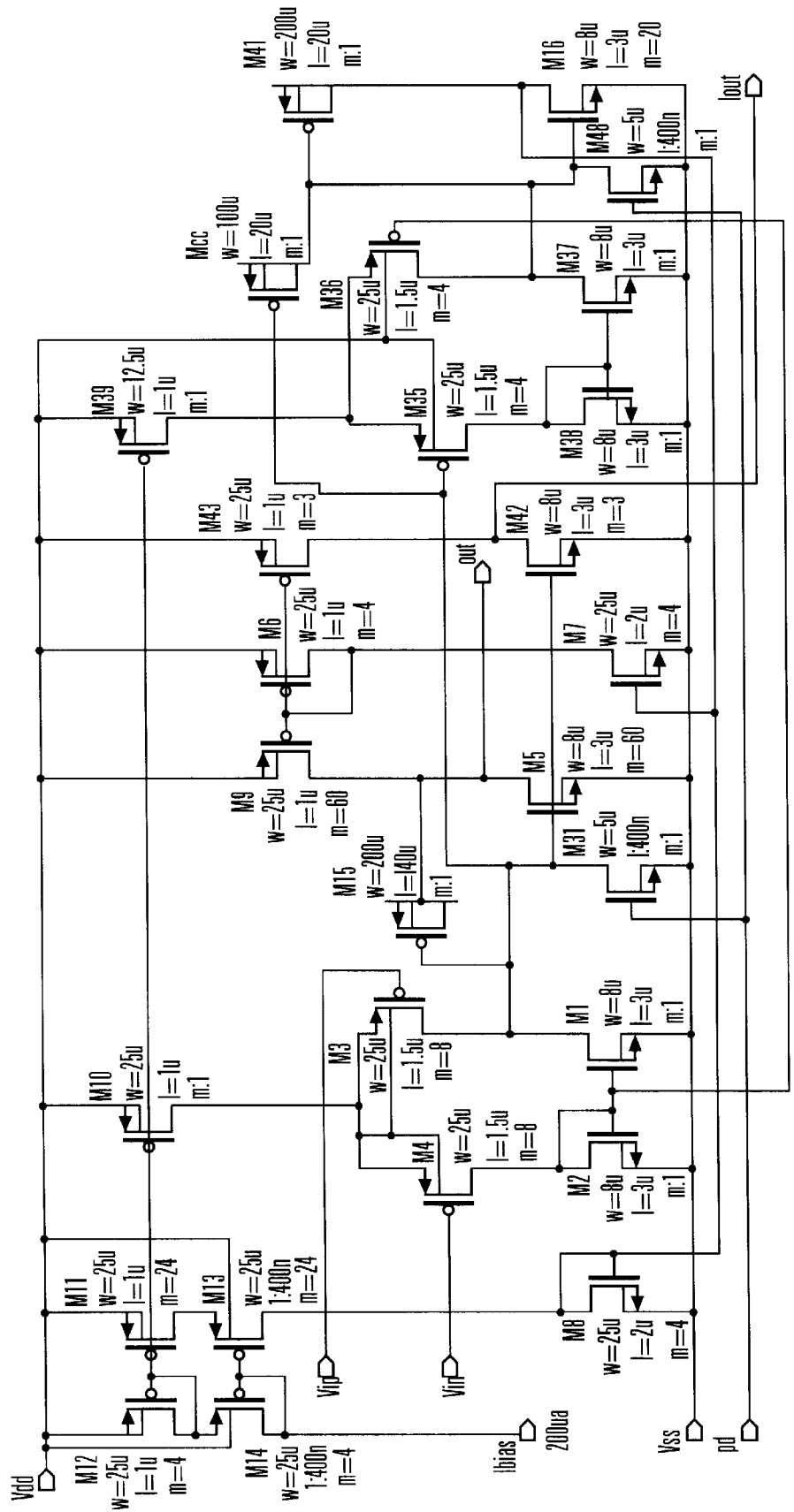
FIG. 6 is a schematic diagram of a specific embodiment of the circuit of FIG. 3 used for a computer simulation of the circuit operation.

Referring to FIG. 6, one implementation of the circuit of FIG. 3 has been modeled (designated as "op_U1") and simulated to demonstrate the operating principles and advantages of the present invention. Individual characteristics and operating parameters of the various circuit elements are identified. For example, output transistor M9 is identified as having 60 channels, each of which is 25 microns wide and 1 micron long. Similar information is provided for each of the remaining transistors.

Figure 7:
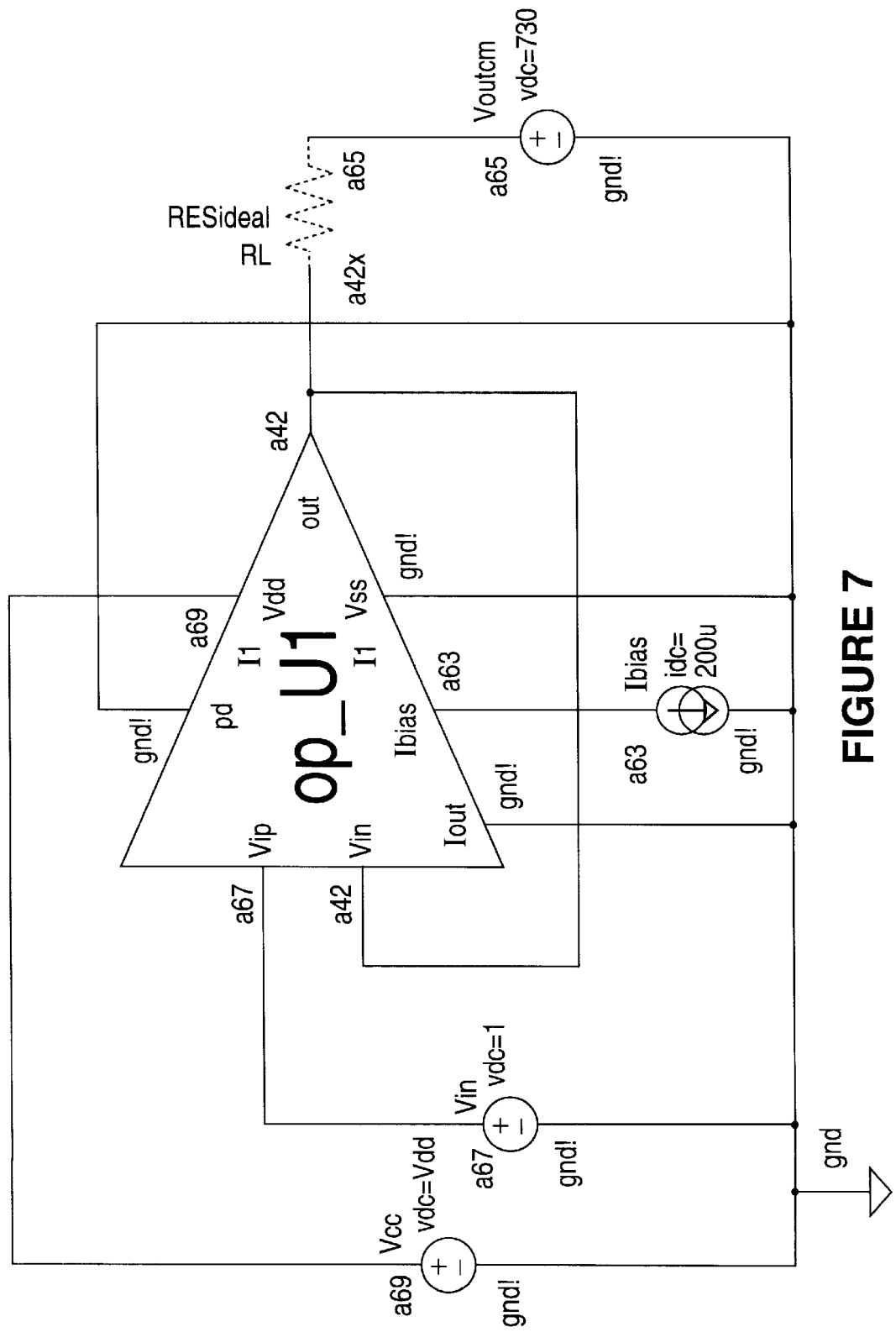
FIG. 7 is a schematic diagram of the biasing and loading of the circuit of FIG. 6 for performing the computer simulation.

Referring to FIG. 7, the circuit of FIG. 6 was biased and loaded in accordance with the voltages, currents and load resistance as indicated.

Figure 8:
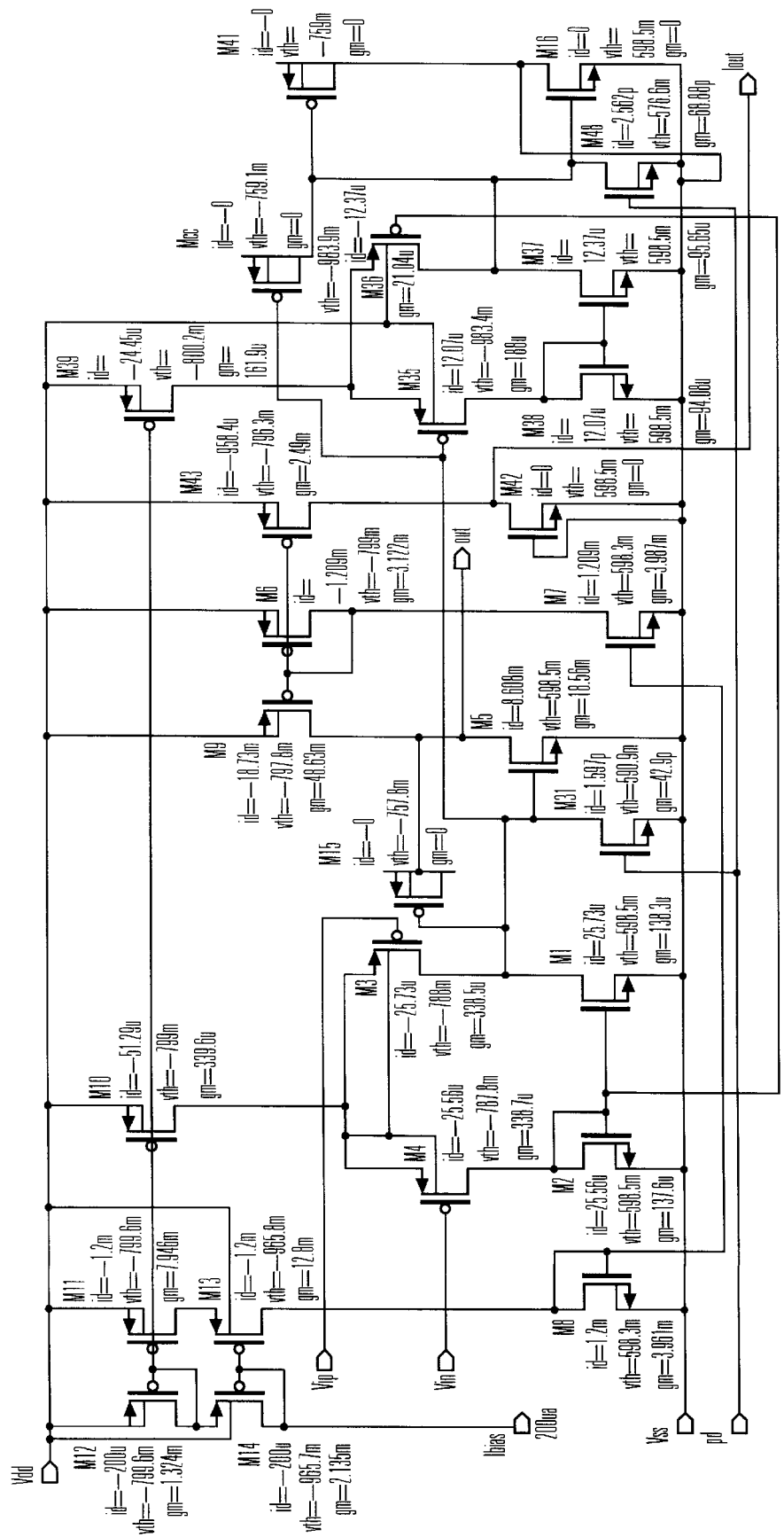
FIG. 8 is a schematic diagram with the operating conditions identified for the circuit of FIG. 7 with a conventional fixed output source current driving a relatively low load resistance.

Referring to FIG. 8, the operating parameters for the circuit of FIG. 6 for a load resistance of 27 ohms and a load current of 10 milliamperes are identified. For example, output transistor M9 has a drain current of 18.73 milliamperes, a threshold voltage of 797.8 millivolts and a transconductance of 48.63 millinihos. As shown, current bypass transistor M16 has been disabled, thereby causing the source current I9 through transistor M9 to remain fixed.

Figure 9:
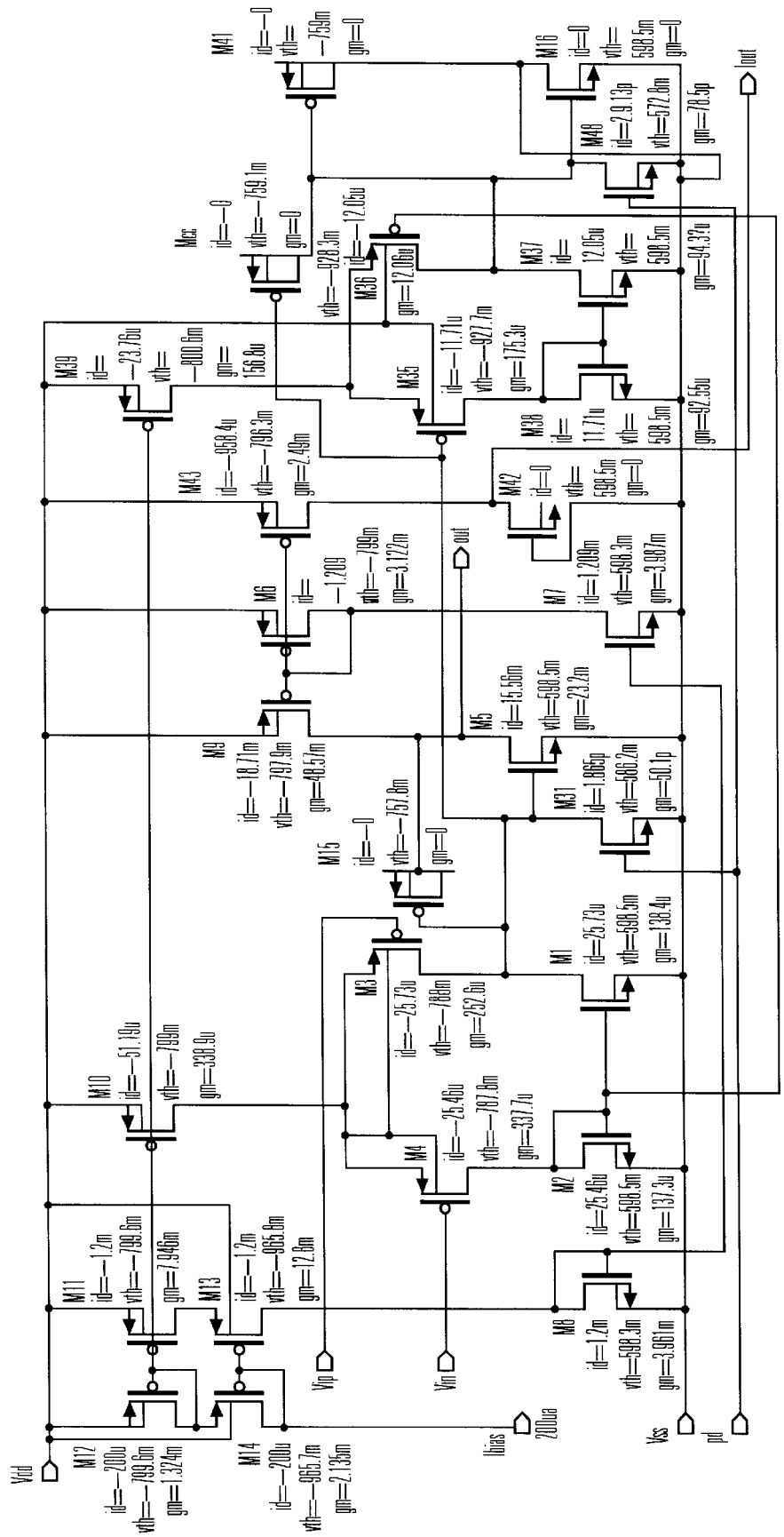
FIG. 9 is a schematic diagram with the operating conditions identified for the circuit of FIG. 7 with a conventional fixed output source current driving a relatively high load resistance.

Referring to FIG. 9, this simulation was repeated for a load resistance of 100 ohms and a load current of 2.7 milliamperes. As indicated, and in accordance with the foregoing discussion, the current provided by the output current source transistor M9 has remained constant even though the load current is significantly reduced.

Figure 10:
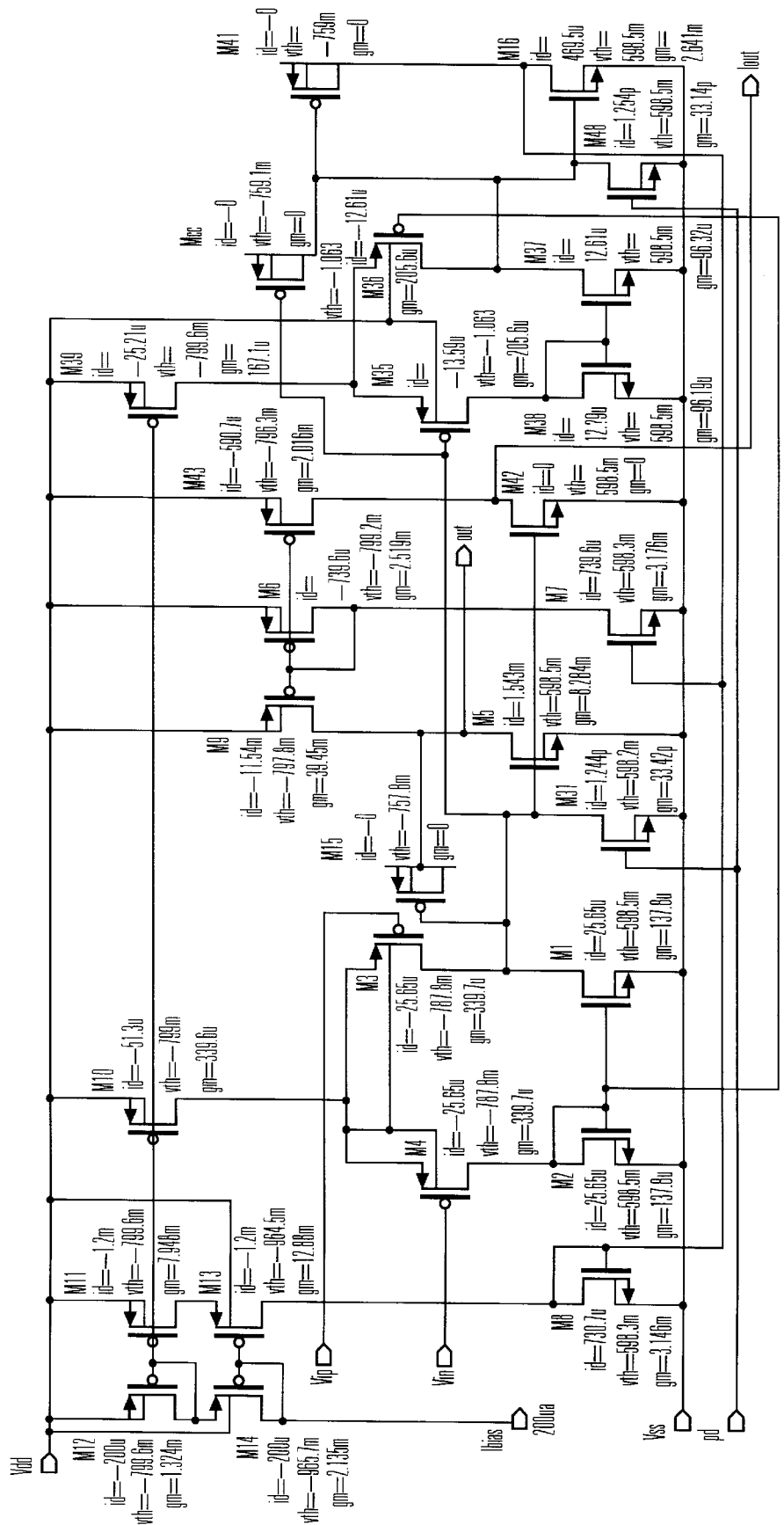
FIG. 10 is a schematic diagram with the operating conditions identified for the circuit of FIG. 7 for a relatively low load resistance with a controlled source current in accordance with the present invention.
Figure 11:
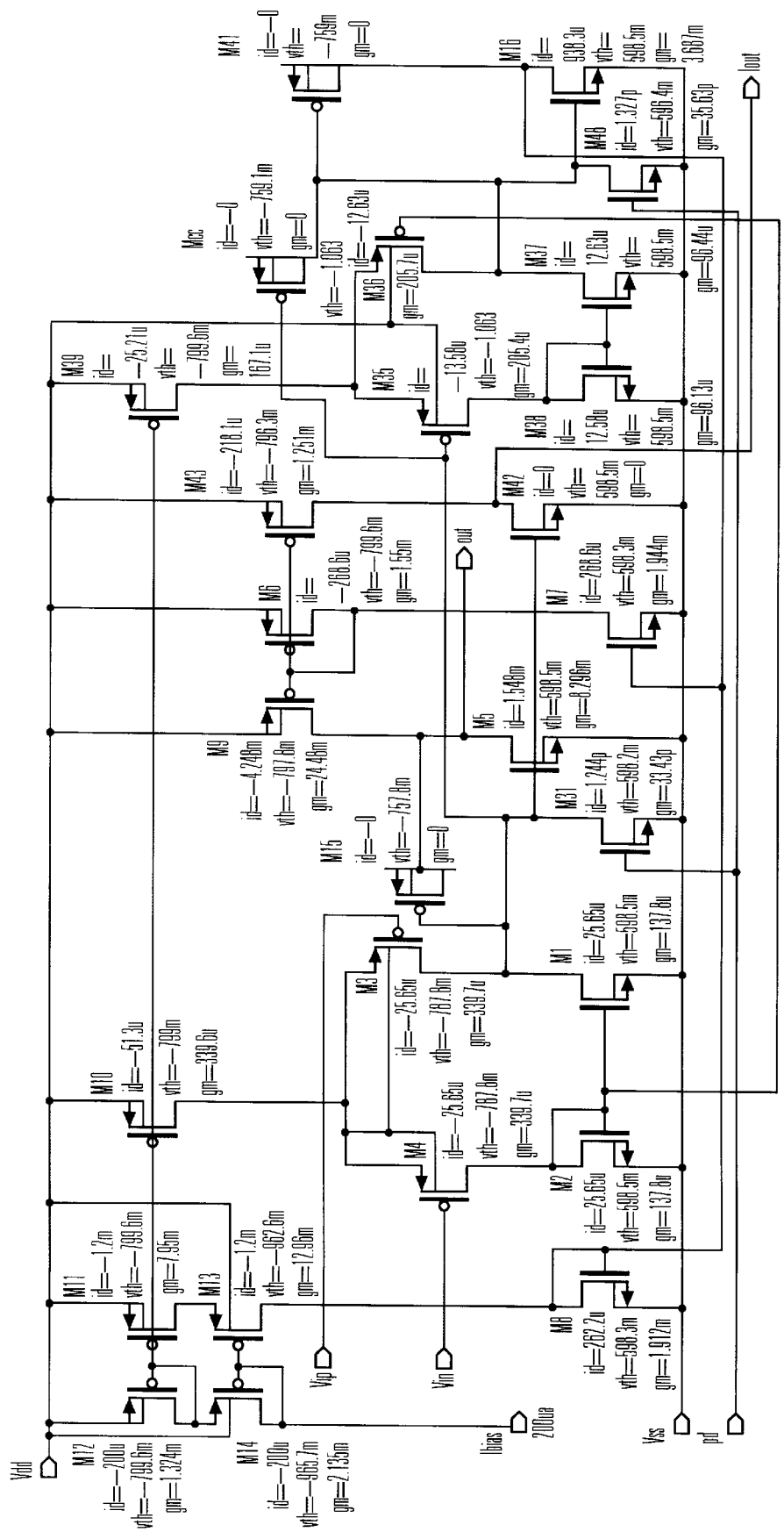
FIG. 11 is a schematic diagram with the operating conditions identified for the circuit of FIG. 7 for a relatively high load resistance with a controlled source current in accordance with the present invention.

Referring to FIGS. 10 and 11, with operation of the current bypass transistor M16 enabled, the circuit of FIG. 6 now operates in accordance with the present invention. As indicated, as the load resistance increases from 27 ohms (FIG. 10) to 100 ohms (FIG. 11) and the load current decreases from 10 milliamperes to 2.7 milliamperes, the output source current through transistor M9 decreases from 11.54 milliamperes to 4.248 milliamperes, respectively.

Figure 12:
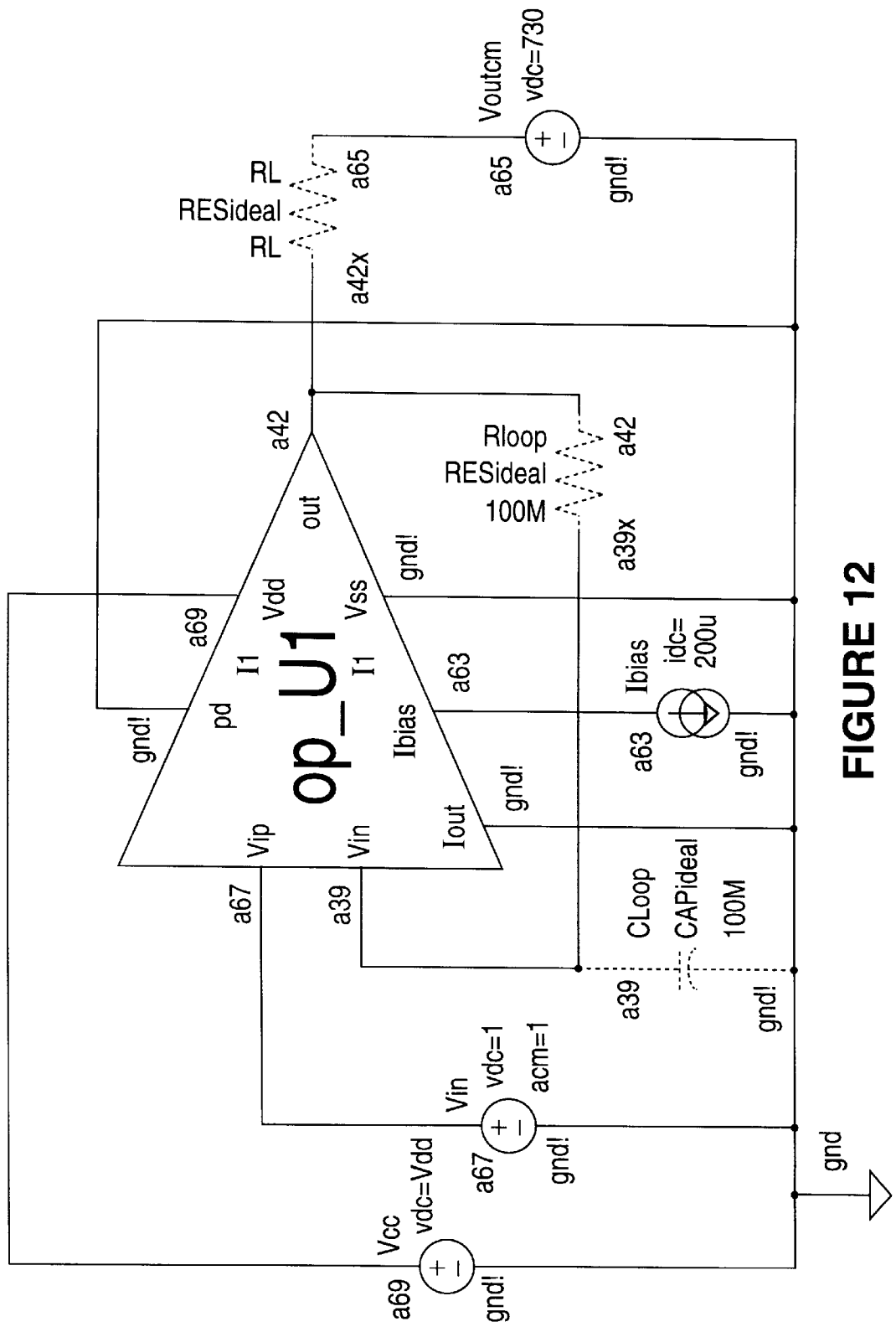
FIG. 12 is a schematic diagram of the biasing and loading of the circuit of FIG. 6 for simulating available signal gain.
Figure 13:
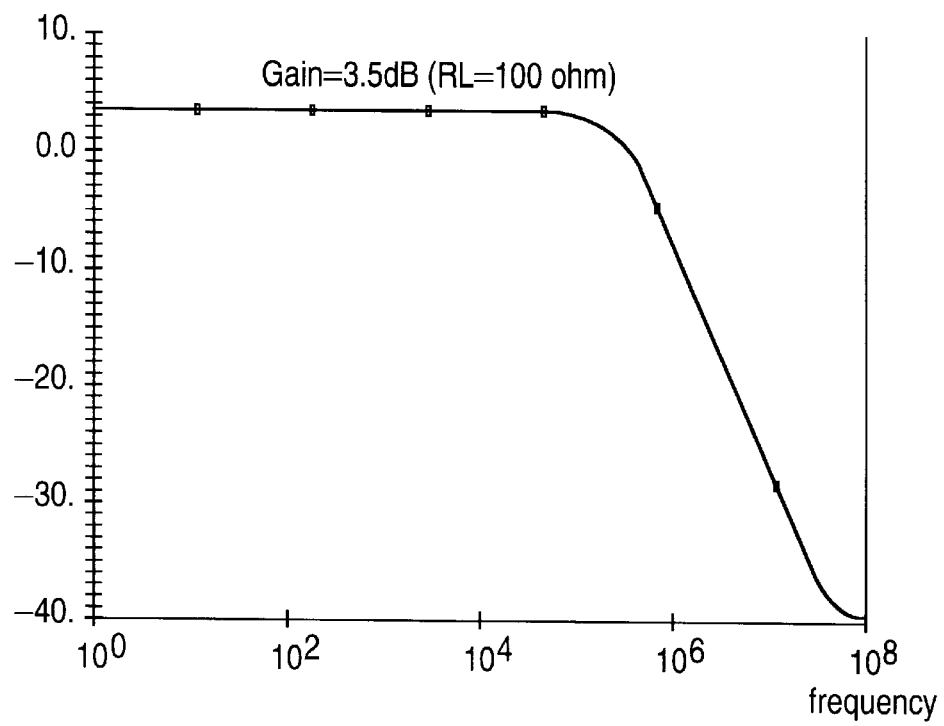
FIG. 13 is a graph of gain versus frequency for the circuit of FIG. 12 with a conventional fixed output source current driving a relatively high load resistance.
Figure 14:
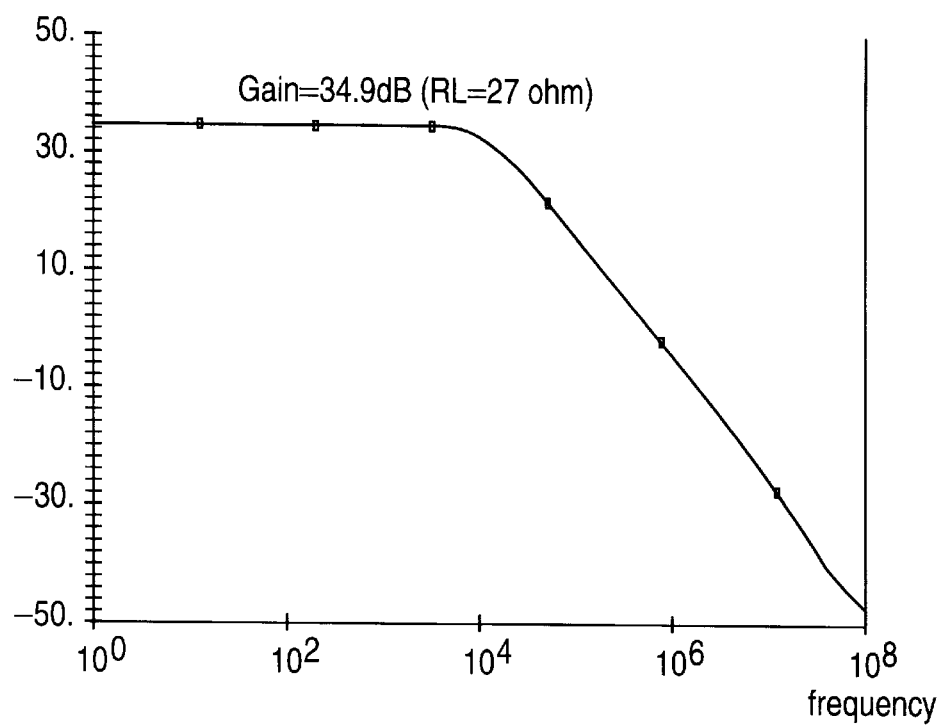
FIG. 14 is a graph of gain versus frequency for the circuit of FIG. 12 with a conventional fixed output source current driving a relatively low load resistance.
Figure 15:
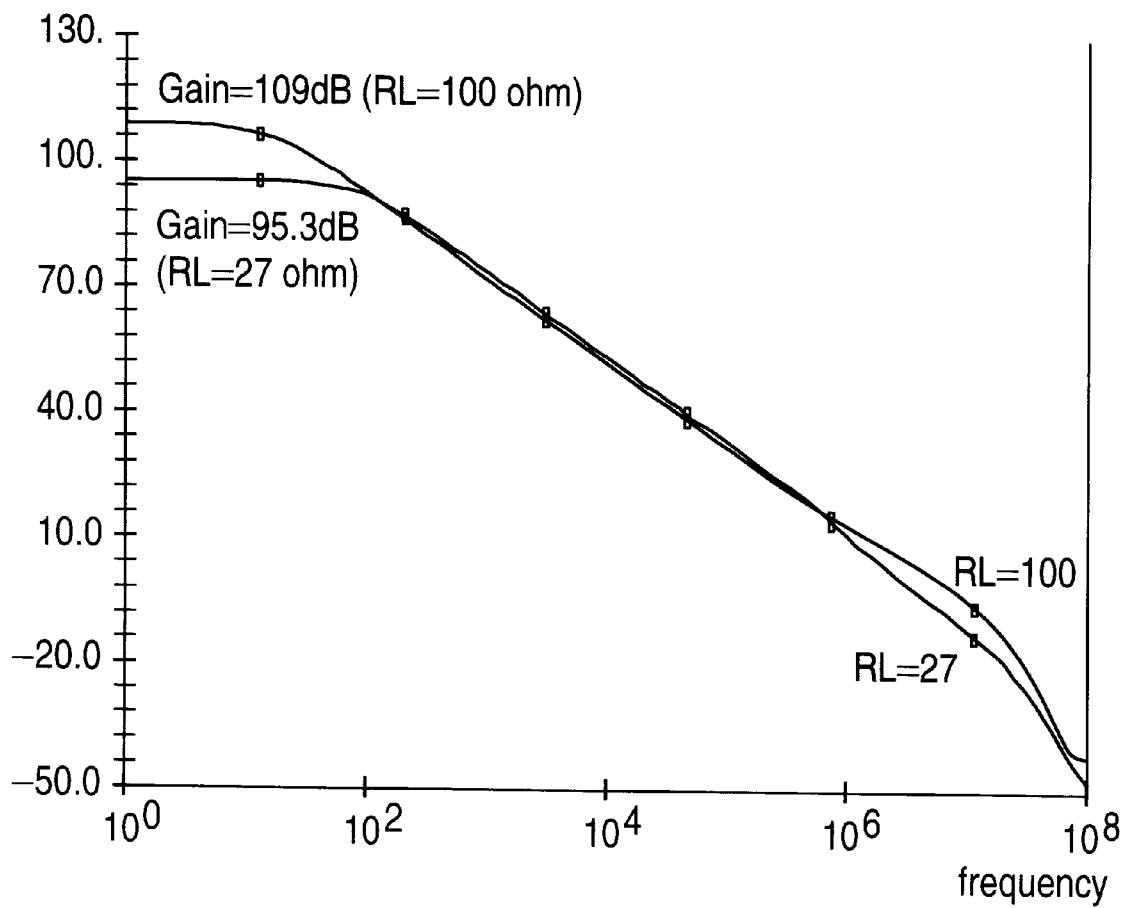
FIG. 15 is a graph of gain versus frequency for the circuit of FIG. 12 using a controlled output source current in accordance with the present invention.

Referring to FIG. 12, the circuit of FIG. 7 was further compensated and loaded for purposes of identifying the increase in gain afforded by a controlled output source current in accordance with the present invention. As indicated in FIGS. 13 and 14, with a fixed output source current, the maximum voltage gain ranges from 3.5 decibels to 34.9 decibels as the load resistance decreases from 100 ohms to 27 ohms. However, referring to FIG. 15, with the increased gain afforded by the control circuit and controlled output source current in accordance with the present invention, the maximum voltage gain is significantly higher and ranges from 109 decibels to 95.3 decibels as the load resistance decreases from 100 ohms to 27 ohms.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a low power class A amplifier circuit, comprising:
    a load circuit terminal configured to convey a variable source current, convey a substantially constant sink current, be coupled to a load circuit and convey a load current for said load circuit;
    an input amplifier circuit configured to provide an internal signal and to receive an input signal and in accordance therewith provide an amplified signal;
    a current sink circuit, coupled between said input amplifier circuit and said load circuit terminal, configured to receive said amplified signal and in accordance therewith conduct said substantially constant sink current;
    a current source circuit, coupled to said load circuit terminal, configured to receive a control signal and in accordance therewith provide said variable source current, wherein said current source circuit comprises a current mirror circuit which includes
        an input circuit configured to receive said control signal and in accordance therewith generate a control current, and
        an output circuit, coupled to said input circuit, configured to receive said control current and in accordance therewith provide said variable source current; and
    a control circuit, coupled between said input amplifier circuit and said current source circuit, configured to receive said internal signal and said amplified signal and in accordance therewith provide said control signal.

2. The apparatus of claim 1, wherein in accordance with said control signal said variable source current varies in relation to said input signal.

3. The apparatus of claim 1, wherein said load circuit includes a load impedance and in accordance with said control signal said variable source current varies in relation to said load impedance.

4. The apparatus of claim 1, wherein said input amplifier circuit comprises a differential amplifier circuit configured to receive a differential signal as said input signal and provide a single-ended signal as said amplified signal.

5. The apparatus of claim 1, wherein said current sink circuit comprises a common source amplifier circuit.

6. An apparatus including a low power class A amplifier circuit, comprising:
    a load circuit terminal configured to convey a variable source current, convey a substantially constant sink current, be coupled to a load circuit and convey a load current for said load circuit;
    an input amplifier circuit configured to receive an input signal and in accordance therewith provide an amplified signal;
    a current sink circuit, coupled between said input amplifier circuit and said load circuit terminal, configured to receive said amplified signal and in accordance therewith conduct said substantially constant sink current;
    a current source circuit, coupled to said load circuit terminal, configured to receive a control signal and in accordance therewith provide said variable source current, wherein said current source circuit comprises a current mirror circuit which includes
        an input circuit configured to receive said control signal and in accordance therewith generate a control current, and
        an output circuit, coupled to said input circuit, configured to receive said control current and in accordance therewith provide said variable source current; and
    a control circuit, coupled between said input amplifier circuit and said current source circuit, configured to receive said amplified signal and in accordance therewith provide said control signal.

7. The apparatus of claim 6, wherein:
    said input circuit comprises an input current mirror circuit configured to receive an input current and said control signal and in accordance therewith generate said control current; and
    said output circuit comprises an output current mirror circuit configured to receive said control current and in accordance therewith generate said variable source current.

8. The apparatus of claim 7, wherein said input current mirror circuit comprises a current bypass circuit configured to receive said control signal and in accordance therewith conduct a portion of said input current.

9. An apparatus including a low power class A amplifier circuit, comprising:
- a load circuit terminal configured to convey a variable source current, convey a substantially constant sink current, be coupled to a load circuit and convey a load current for said load circuit;
- an input amplifier circuit configured to receive an input signal and in accordance therewith provide an amplified signal;
- a current sink circuit, coupled between said input amplifier circuit and said load circuit terminal, configured to receive said amplified signal and in accordance therewith conduct said substantially constant sink current;
- a current source circuit, coupled to said load circuit terminal, configured to receive a control signal and in accordance therewith provide said variable source current; and
- a control circuit, coupled between said input amplifier circuit and said current source circuit, configured to receive said amplified signal and in accordance therewith provide said control signal, wherein said control circuit includes
  - a first input terminal coupled to said input amplifier circuit internal terminal,
  - a second input terminal coupled to said input amplifier circuit signal terminal, and
  - an output terminal coupled to said current source circuit.

10. The apparatus of claim 9, wherein said control circuit comprises a transconductance circuit configured to receive a differential voltage signal via said input amplifier circuit internal and signal terminals and in accordance therewith provide a single-ended current signal as said control signal.

11. An apparatus including a low power class A amplifier circuit, comprising:
- a load circuit terminal configured to convey source and sink currents, be coupled to a load circuit and convey a load current for said load circuit;
- an input amplifier circuit which includes internal and signal terminals and is configured to receive an input signal and in accordance therewith provide an amplified signal via said signal terminal;
- a current sink circuit, coupled between said input amplifier circuit signal terminal and said load circuit terminal, configured to receive said amplified signal and in accordance therewith conduct said sink current;
- a current source circuit, coupled to said load circuit terminal, configured to receive a control signal and in accordance therewith provide said source current; and
- a control circuit, coupled between said input amplifier circuit internal and signal terminals and said current source circuit, configured to receive said amplified signal and in accordance therewith provide said control signal, wherein in accordance with said control signal said sink current is substantially constant and said source current varies in relation to said input signal.

12. The apparatus of claim 11, wherein said input amplifier circuit comprises a differential amplifier circuit configured to receive a differential signal as said input signal and provide a single-ended signal as said amplified signal.

13. The apparatus of claim 11, wherein said current sink circuit comprises a common source amplifier circuit.

14. The apparatus of claim 11, wherein said current source circuit comprises a current mirror circuit which includes:
- an input circuit configured to receive said control signal and in accordance therewith generate a control current; and
- an output circuit, coupled to said input circuit, configured to receive said control current and in accordance therewith provide said source current.

15. The apparatus of claim 14, wherein:
- said input circuit comprises an input current mirror circuit configured to receive an input current and said control signal and in accordance therewith generate said control current; and
- said output circuit comprises an output current mirror circuit configured to receive said control current and in accordance therewith generate said source current.

16. The apparatus of claim 15, wherein said input current mirror circuit comprises a current bypass circuit configured to receive said control signal and in accordance therewith conduct a portion of said input current.

17. The apparatus of claim 11, wherein said control circuit includes:
- a first input terminal coupled to said input amplifier circuit internal terminal;
- a second input terminal coupled to said input amplifier circuit signal terminal; and
- an output terminal coupled to said current source circuit.

18. The apparatus of claim 17, wherein said control circuit comprises a transconductance circuit configured to receive a differential voltage signal via said input amplifier circuit internal and signal terminals and in accordance therewith provide a single-ended current signal as said control signal.

19. An apparatus including a low power class A amplifier circuit, comprising:
- a load circuit terminal configured to convey source and sink currents, be coupled to a load circuit which includes a load impedance and convey a load current for said load circuit;
- an input amplifier circuit which includes internal and signal terminals and is configured to receive an input signal and in accordance therewith provide an amplified signal via said signal terminal;
- a current sink circuit, coupled between said input amplifier circuit signal terminal and said load circuit terminal, configured to receive said amplified signal and in accordance therewith conduct said sink current;
- a current source circuit, coupled to said load circuit terminal, configured to receive a control signal and in accordance therewith provide said source current; and
- a control circuit, coupled between said input amplifier circuit internal and signal terminals and said current source circuit, configured to receive said amplified signal and in accordance therewith provide said control signal, wherein in accordance with said control signal said sink current is substantially constant and said source current varies in relation to said load impedance.

20. The apparatus of claim 19, wherein said input amplifier circuit comprises a differential amplifier circuit configured to receive a differential signal as said input signal and provide a single-ended signal as said amplified signal.

21. The apparatus of claim 19, wherein said current sink circuit comprises a common source amplifier circuit.

22. The apparatus of claim 19, wherein said current source circuit comprises a current mirror circuit which includes:
- an input circuit configured to receive said control signal and in accordance therewith generate a control current; and an output circuit, coupled to said input circuit, configured to receive said control current and in accordance therewith provide said source current.

23. The apparatus of claim 22, wherein:

said input circuit comprises an input current mirror circuit configured to receive an input current and said control signal and in accordance therewith generate said control current; and said output circuit comprises an output current mirror circuit configured to receive said control current and in accordance therewith generate said source current.

24. The apparatus of claim 23, wherein said input current mirror circuit comprises a current bypass circuit configured to receive said control signal and in accordance therewith conduct a portion of said input current.

25. The apparatus of claim 19, wherein said control circuit includes:

a first input terminal coupled to said input amplifier circuit internal terminal;

a second input terminal coupled to said input amplifier circuit signal terminal; and an output terminal coupled to said current source circuit.

26. The apparatus of claim 25, wherein said control circuit comprises a transconductance circuit configured to receive a differential voltage signal via said input amplifier circuit internal and signal terminals and in accordance therewith provide a single-ended current signal as said control signal.

* * * * *